United States Patent [19]

Okita

[11] Patent Number: 4,749,663

[45] Date of Patent: Jun. 7, 1988

[54] PROCESS OF FABRICATING A SEMICONDUCTOR IC INVOLVING SIMULTANEOUS SPUTTER ETCHING AND DEPOSITION

[75] Inventor: Yoshihisa Okita, Tokyo, Japan

[73] Assignee: Oki Electric Industry Co., Ltd., Tokyo, Japan

[21] Appl. No.: 66,082

[22] Filed: Jun. 24, 1987

[30] Foreign Application Priority Data

Jul. 2, 1986 [JP] Japan .................. 61-154137

[51] Int. Cl.⁴ .................. H01L 21/465
[52] U.S. Cl. .................. 437/228; 437/238; 204/192.37
[58] Field of Search .......... 437/195, 228, 238, 225, 437/229; 148/DIG. 51, DIG. 158; 156/653, 643, 657, 659.1; 204/192.37, 192.35, 192.32, 192.3, 192.23, 192 E

[56] References Cited

U.S. PATENT DOCUMENTS

| | | | |
|---|---|---|---|
| 4,518,629 | 5/1985 | Jeuch | 437/195 |
| 4,545,852 | 10/1985 | Barton | 437/228 |
| 4,601,781 | 7/1986 | Mercier et al. | 204/192.37 |
| 4,605,470 | 8/1986 | Gwozdz et al. | 204/192.37 |
| 4,681,653 | 7/1987 | Purdes et al. | 204/164 |
| 4,690,746 | 9/1987 | McInerney et al. | 204/192.37 |

FOREIGN PATENT DOCUMENTS 0029132 2/1986 Japan ............. 228/

OTHER PUBLICATIONS

Kotani et al, "Sputter Etching Planarization . . . ", J. Electrochem. Soc., vol. 130, No. 3, 4/83, pp. 645–648.

Primary Examiner—Brian E. Hearn
Assistant Examiner—Kevin McAndrews
Attorney, Agent, or Firm—Spencer & Frank

[57] ABSTRACT

In a process of fabricating a semiconductor IC having a plurality of metal wiring conductor layers on a semiconductor substrate and an insulation layer between the metal wiring conductor layers, the insulation layer being formed of a silicon oxide film is formed by means of RF bias-sputtering, a silicon oxide film is formed by means of RF bias sputtering under such a condition that the deposition rate and the etching rate on a pattern surface 45° inclined with respect to the reference surface of the semiconductor substrate are equal, part of the silicon oxide film over the underlying metal wiring conductor layer being protruded; a trench is formed in part of the silicon oxide film covering the metal wiring conductor layer, and the silicon oxide is etched by RF bias sputtering under such a condition that the deposition rate and etching rate on a pattern surface parallel to the reference surface of the semiconductor substrate are equal, until the protrusion of the silicon oxide film over the metal wiring conductor is removed so that the entire silicon oxide film is planarized.

6 Claims, 6 Drawing Sheets

વ4,749,663

PROCESS OF FABRICATING A SEMICONDUCTOR IC INVOLVING SIMULTANEOUS SPUTTER ETCHING AND DEPOSITION

BACKGROUND OF THE INVENTION

The present invention relates to a process of fabricating a semiconductor IC (integrated circuit) having a multilevel metalization structure, particularly to a process of fabricating a planarized multilevel metalization by means of RF (radio frequency) bias-sputtered SiO$_2$ (hereinafter referred to as BSQ).

In order to increase the degree of integration and the operational speed, stable production of minute multilevel metalization is vital. A technique for the stable production of minute multilevel metalization is a planarization of an intermediate insulating layer using the BSQ.

FIG. 1 is a schematic view showing an example of BSQ forming apparatus. As illustrated, a substrate 13 and a target 15 are electrically connected through a substrate electrode 12 and a target electrode 16 to a substrate RF power supply 14 and a target RF power supply 17.

For the formation of BSQ, the chamber 11 is evacuated through an exhaust port 18 while at the same time Ar gas is introduced through an Ar inlet 19 to make the degree of vacuum into the order of $10^{-3}$ to $10^{-2}$ Torr. The substrate RF power supply 14 and the target RF power supply 17 are both made operative, by which both sputter deposition and sputter etching are made to take place concurrently on the substrate 13.

FIG. 2 shows a characteristic of deposition rate versus the angle between the pattern surface and the substrate surface (reference surface). In FIG. 2, the vertical axis represents the thickness (the dimension in the direction normal to the pattern surface) of the BSQ film which grows, when the target alone is supplied with the RF power, on the surface of the pattern that is formed in advance on the substrate. Here, the thickness of the BSQ film is defined as the dimension of the film normal to the pattern surface. It is seen from FIG. 2 that the BSQ film thickness varies with the angle between the pattern surface and the substrate surface.

FIG. 3 shows the etching rate versus the angle between the BSQ surface and the substrate surface. The vertical axis represents the amount of etching (in the direction of the BSQ surface) of the BSQ that results when the substrate alone is supplied with the RF power, the BSQ being formed in advance on the substrate. It is seen from FIG. 3 that the amount of etching varies with the angle between the BSQ surface and the substrate surface. The maximum etching rate is obtained when the BSQ surface angle is 45°.

Actually, to form BSQ, the target and the substrate are both supplied with RF power, the dependency of the rate of film thickness growth on the angle is the difference between the values in FIG. 2 and FIG. 3. To form an interlayer insulator by the use of BSQ, the following method comprising two steps is performed in which the above characteristics are utilized.

In the first step, the ratio between the target power and the substrate power is selected in such a way that the rate of effective film growth on a surface 45° inclined with respect to the substrate surface is 0. This is illustrated in FIG. 4, in which the curve C represents the deposition rate, the curve B represents the etching rate and the curve A represents the effective film growth rate which is the difference between the curves C and B.

When the BSQ film 20 grown until the thickness Tt of the part of the film having a horizontal surface is equal to the sum of the thickness Tm of the underlying pattern and the desired interlayer insulation film T1, the profile will be as indicated by solid line 21 in FIG. 5. The dashed lines 22a, 22b, 22c in FIG. 5 indicates the profiles in the process of the film growth. It will be seen from FIG. 5 that at the end of the first step, the profile of the BSQ has a protrusion 24 over the underlying metal pattern 30.

In the second step, the ratio between the target power and the substrate power is chosen so that the etching rate on a horizontal surface is zero. This is illustrated in FIG. 6, in which the curve A represents the effective film growth rate, the curve B represents the etching rate, and the curve C represents the deposition rate. The etching is performed until the protrusion 24 of the BSQ film 20 is removed, that is until the profile of the BSQ film 20 becomes as indicated in the solid line 28 in FIG. 7, to result in a flat interlayer insulation film. The dashed lines 29a, 29b, 29c in FIG. 7 indicate the profiles in the process of etching.

An example of prior art of the kind described above is disclosed in Japanese Patent Application Laid open No. 13905/1980.

The above-described process has a disadvantage in that the time required for the second step is dependent on the width of the underlaying pattern 30 beneath the BSQ film 20 to be planarized. Accordingly, when the underlying pattern 30 is wide or has large dimensions, it takes a very long time for the protrusion to be completely removed, i.e., for the planarization to be completed. Assume for instance, when the etchback rate in the horizontal direction of the 45° inclined surface at the second step in 1000Å/min. Then, the time required for the planarization of the BSQ film on the pattern 2 to 6 micrometers wide is 10 to 20 minutes, while it is 190 minutes for the pattern 40 micrometers wide, and 490 minutes for the pattern 100 micrometers wide. Thus, the complete planarization by the use of the two-step BSQ process has a low productivity.

Moreover, subjecting the substrate to an RF plasma for a long time can cause degrade the characteristic of the device.

If planarization over wide patterns are given up in order to improve the productivity, the capacitance of the capacitor can be different from the designed value, the interlayer connection in the bonding pad becomes difficult, and a step can be formed in the bonding pad thereby degrading the bondability.

SUMMARY OF THE INVENTION

An object of the invention is to remove the dependency of the planarization time on the pattern width, thereby providing a process of fabricating a semiconductor device which can realize complete planarization of the BSQ film without degrading the device characteristic.

According to the invention, a trench is formed by photolithography on the BSQ film over a wide pattern, after the first step, and in the second step of planarization, etchback is made to take place on the sidewalls of the trench. In this way, the second step of planarization is completed in a short time.

DETAILED DESCRIPTION OF THE PREFERRED EMBODIMENTS

As embodiment of the invention will be described with reference to FIGS. 8A to 8F.

Figure 1:
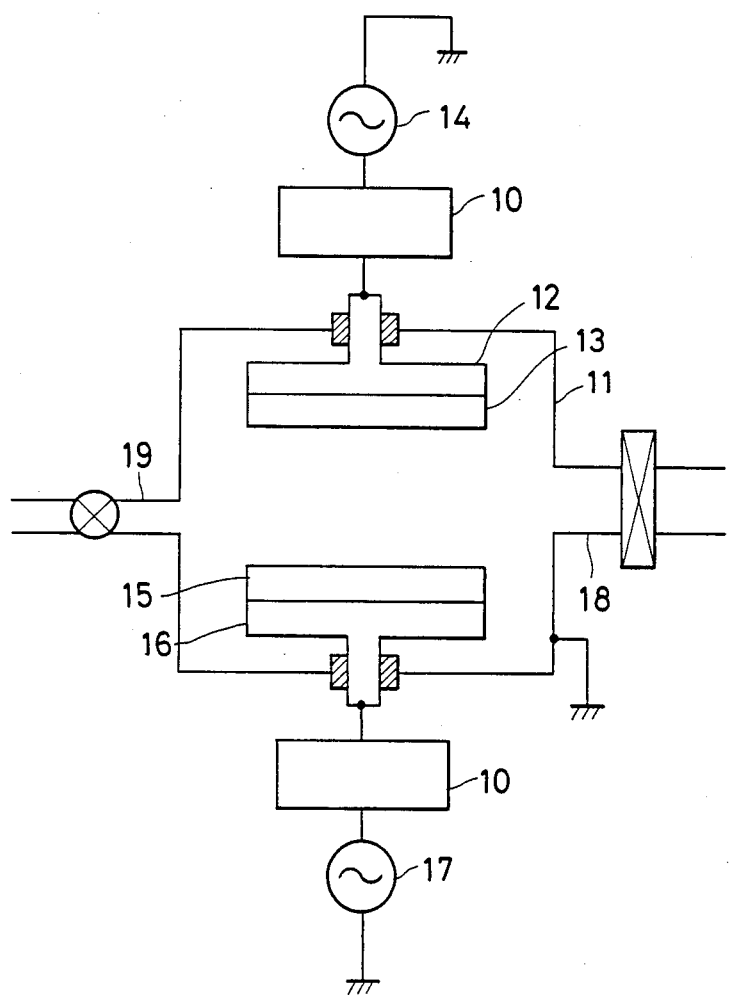
FIG. 1 is a schematic view showing a general construction of a BSQ forming apparatus.
Figure 2:
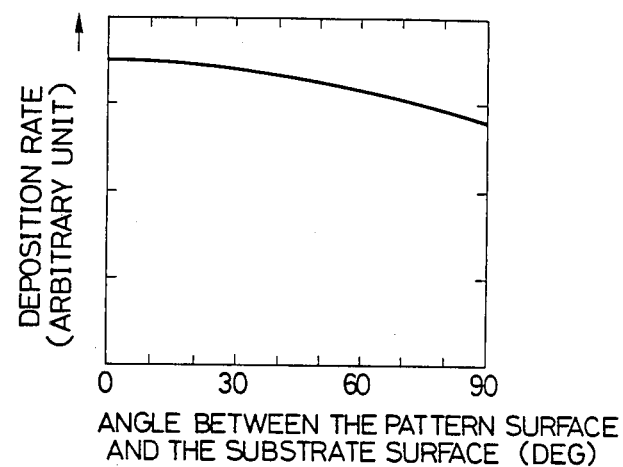
FIG. 2 is a diagram showing the deposition rate versus the angle between the pattern surface and the substrate surface.
Figure 3:
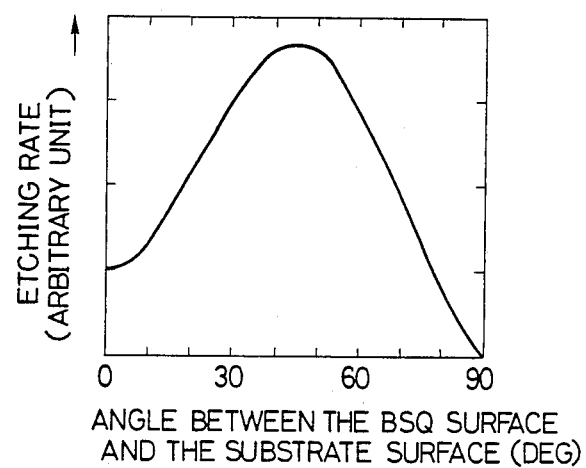
FIG. 3 is a diagram showing the etching rate versus the angle between the BSQ surface and the substrate surface.
Figure 4:
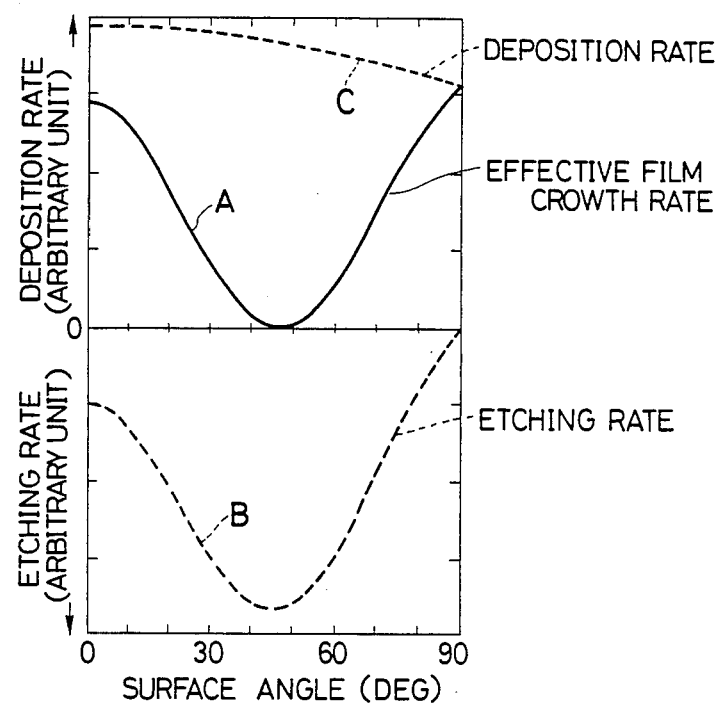
FIG. 4 is a diagram showing the BSQ deposition rate versus the surface inclination.
Figure 5:
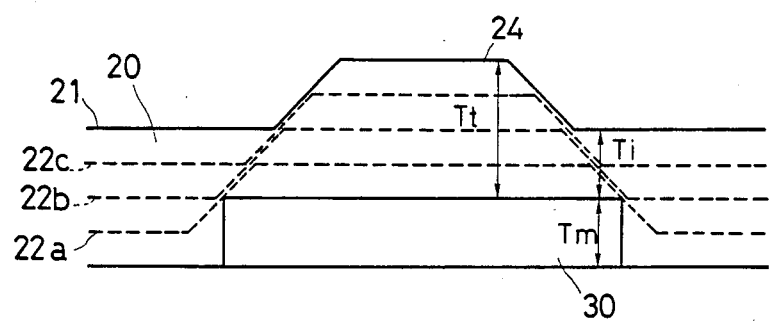
FIG. 5 is a cross sectional view showing how the BSQ is grown.
Figure 6:
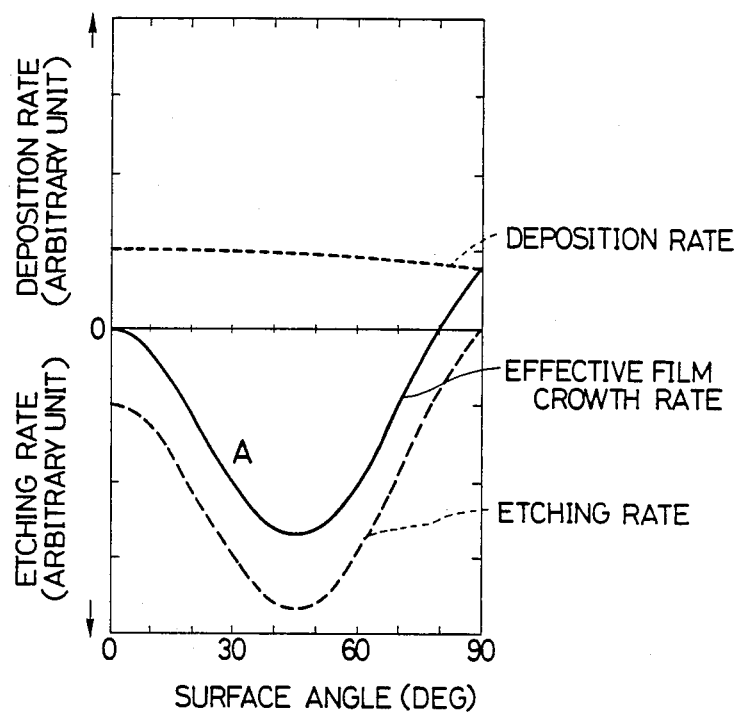
FIG. 6 is a diagram showing the BSQ etching rate versus the surface inclination.
Figure 8:
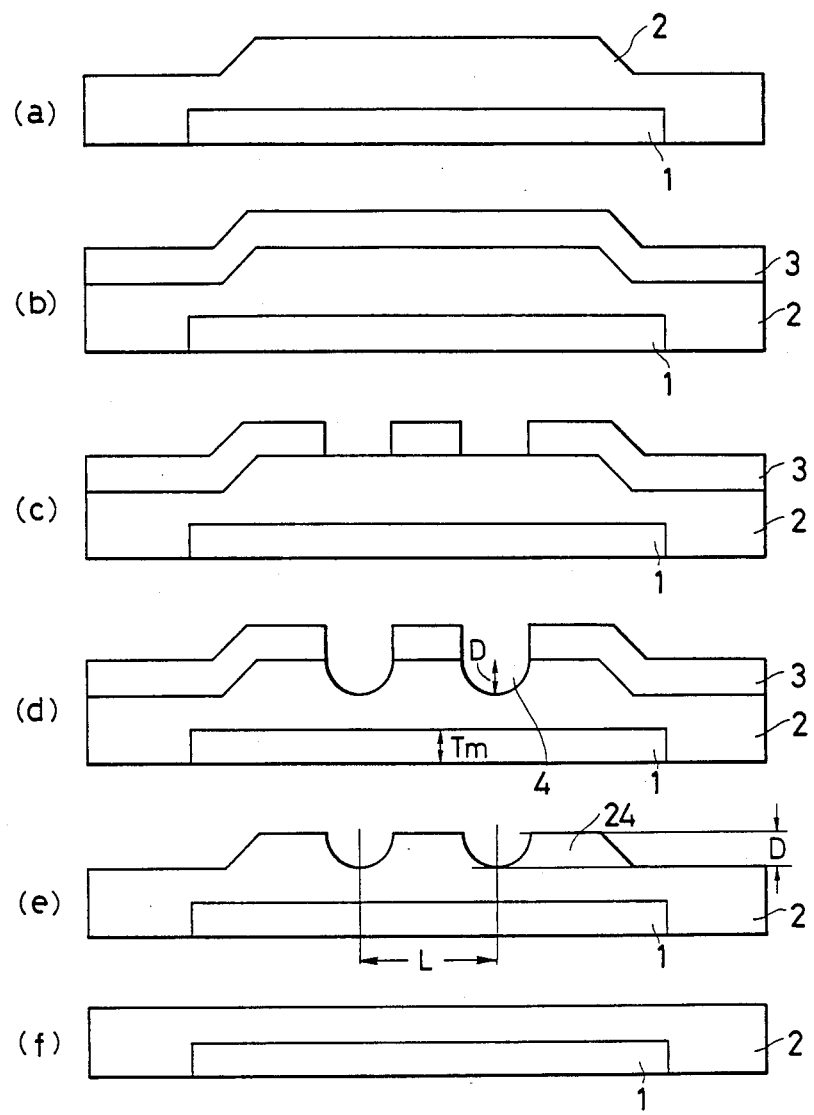
FIGS. 8A to 8F are cross sectional views showing various steps of the process of fabricating semiconductor IC of an embodiment of the invention.

First, as shown in FIG. 8A, a BSQ film 2 is deposited under the condition described with reference to FIG. 4. The BSQ film 2 has a protrusion 24 over the underlying metal wiring conductor layer 30.

Next, as shown in FIG. 8B, photoresist 3 is applied on the BSQ 2 film.

Then, as shown in FIG. 8C, selective irradiation and development of the photoresist 3, e.g., a positive photoresist, are performed to leave patterned photoresist 3.

Then, as shown in FIG. 8D, trenches 4 are formed in the BSQ film 2, by isotropic, wet etching using the patterned photoresist 3 as a mask. The depth D of the trenches 4 are made equal to the thickness Tm of the underlying metal wiring conductor layer 1. The profile of each trench 4 is semi-circular as shown in FIG. 8D.

Then, as shown in FIG. 8E, the photoresist 3 is removed.

Figure 7:
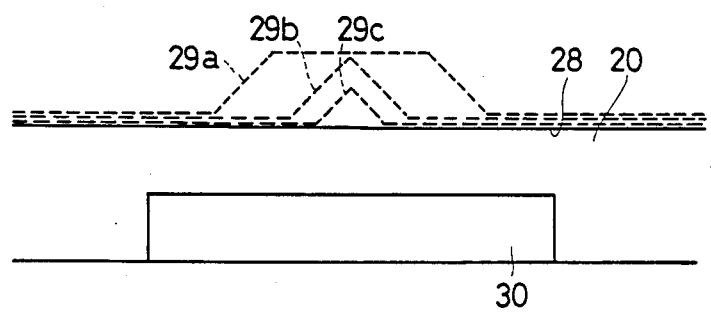
FIG. 7 is a cross sectional view showing how the BSQ is etched.

Then, etchback of the BSQ film 2 having the trenches 4 is performed under the conditions described with reference to FIG. 7. As a result, the etchback in the horizontal direction occur also on the sidewalls of the trenches. When the horizontal etch-back is completed, the protrusion 24 is completely removed and the BSQ film is completely planarized, as shown in FIG. 8F.

In forming the trenches, care should be taken on the following points. First, the width of each trench should be fixed at a dimension (about 2 micrometers) at which the patterning can be accomplished stably by use of an irradiation apparatus of the projection exposure type. The dependency of the etching depth on the width of the trench can thereby avoided. The number of trenches can be selected according to the width of the underlying pattern. The pitch L of the trenches should be made at 3 to 4 micrometers.

By the provision of the trenches on the protrusions 24 over wide underlying patterns, the function of the horizontal etch-back is fully utilized, and the planarization is accomplished in a short time. The time required for the second step of planarization is dependent on the largest one of the distances between the adjacent trenches or the distance between the trench and the outer inclined surface of the BSQ, as well as on the profile of each trench.

In this way, perfect planarization of the interlayer insulation film can be accomplished in a short time.

This will enable stable formation of a multilevel metalization of semiconductor IC's, miniaturization of the wiring conductors, and decrease of the resistances of the wiring conductors, and hence realization of high-speed, high-density semiconductor IC's.

Figure 9:
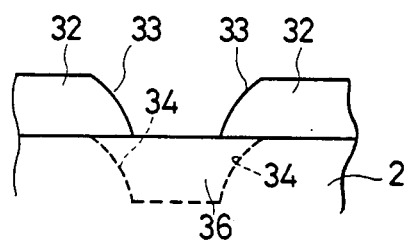
FIGS. 9 and 10 show trenches that can also be used.

In place of the isotropic etching for the formation of the trenches, taper etching can be employed. In this taper etching, resist patterns 32 having gradually descending edges 33, as shown in FIG. 9 is used, and anisotrpic dry etching is performed to transfer the profile of the resist patterns 32 into the profile of the sidewells 34 of the trench 36. Sidewalls 34 having angle of inclination of 60° to 70° can be obtained.

Figure 10:
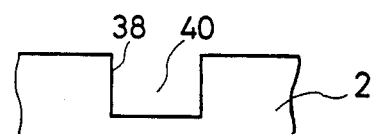

Although anisotropic etching could also be used to form trenches 40 having vertical sidewalls 38 (FIG. 10), sidewalls having semicircular profile or inclined. sidewells are advantageous in that the initial etching rate (in the lateral direction) is higher. The ideal profile is a straight line 45 inclined, but straight lines having the angle of inclination close to 45° or curves (such as the semi-circular) generatlly close to 45° straight line are also desirable.

What is claimed is:

1. A process of fabricating a semiconductor IC having a plurality of metal wiring conductor layers on a semiconductor substrate and an insulation layer between the metal wiring conductor layers, the insulation layer being formed of a silicon oxide film formed by RF bias-sputtering, said process comprising the steps of:
   (a) forming a silicon oxide film having a thickness equal to the sum of the thickness of the underlying metal wiring conductor layer and the ultimate interlayer insulation layer, by means of RF bias sputtering under such a condition that the deposition rate and the etching rate on a pattern surface 45° inclined with respect to the reference surface of the semiconductor substrate are substantially equal to each other, part of the silicon oxide film over the underlying metal wiring conductor layer being protruded,
   (b) forming a trench in part of the silicon oxide film covering the metal wiring conductor layer, the trench having a depth equal to the metal wiring conductor layer that is covered by the silicon oxide, and
   (c) etching the silicon oxide by RF bias sputtering under such a condition that the deposition rate and etching rate on a pattern surface parallel to the reference surface of the semiconductor substrate are substantially equal to each other, until the protrusion of the silicon oxide film over the metal wiring conductor is removed so that the entire silicon oxide film is planarized.

2. A process according to claim 1, wherein the trench is formed by photolithography.

3. A process according to claim 2, wherein the trench is formed by isotropic etching so that the profile of the trench is semi-circular.

4. A process according to claim 3, wherein the width of the trench is about 2 micrometers.

5. A process according to claim 3, wherein more than one trench is provided and the trenches are provided at a pitch of about 3 to 4 micrometers.

6. A process according to claim 2, wherein the trench is formed by taper etching so that the sidewalls of the trench is inclined.

* * * * *